United States Patent
Khalil et al.

(10) Patent No.: US 10,325,997 B2
(45) Date of Patent: Jun. 18, 2019

(54) VERTICAL III-NITRIDE SEMICONDUCTOR DEVICE WITH A VERTICALLY FORMED TWO DIMENSIONAL ELECTRON GAS

(71) Applicant: HRL Laboratories, LLC, Malibu, CA (US)

(72) Inventors: Sameh G. Khalil, Encino, CA (US); Andrea Corrion, Oak Park, CA (US); Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 164 days.

(21) Appl. No.: 15/286,367

(22) Filed: Oct. 5, 2016

(65) Prior Publication Data
US 2017/0025518 A1    Jan. 26, 2017

Related U.S. Application Data

(62) Division of application No. 14/329,745, filed on Jul. 11, 2014, now Pat. No. 9,490,357.
(Continued)

(51) Int. Cl.
*H01L 29/66* (2006.01)
*H01L 21/265* (2006.01)
(Continued)

(52) U.S. Cl.
CPC .... *H01L 29/66462* (2013.01); *H01L 21/2654* (2013.01); *H01L 21/30612* (2013.01);
(Continued)

(58) Field of Classification Search
None
See application file for complete search history.

(56) References Cited

U.S. PATENT DOCUMENTS

| 4,754,310 A | 6/1988 | Coe |
|---|---|---|
| 7,038,253 B2 | 5/2006 | Yoshida et al. |

(Continued)

FOREIGN PATENT DOCUMENTS

| EP | 1883115 A1 | 1/2008 |
|---|---|---|
| EP | 2549528 | 1/2013 |

(Continued)

OTHER PUBLICATIONS

From Chinese Application No. 201480031378.6, Office Action dated Jun. 20, 2017 and it's machine English translation from Global Dossier.

(Continued)

*Primary Examiner* — Robert K Carpenter
(74) *Attorney, Agent, or Firm* — Ladas & Parry

(57) ABSTRACT

A HEMT device comprising a III-Nitride material substrate, the surface of which follows a plane that is not parallel to the C-plane of the III-Nitride material; an epitaxial layer of III-Nitride material grown on said substrate; a recess etched in said epitaxial layer, having at least one plane wall parallel to a polar plane of the III-Nitride material; a carrier supply layer formed on a portion of the plane wall of the recess, such that a 2DEG region is formed along the portion of the plane wall of the recess; a doped source region formed at the surface of said epitaxial layer such that the doped source region is separated from said 2DEG region by a channel region of the epitaxial layer; a gate insulating layer formed on the channel region of the epitaxial layer; and a gate contact layer formed on the gate insulating layer.

12 Claims, 5 Drawing Sheets

Related U.S. Application Data

(60) Provisional application No. 61/846,489, filed on Jul. 15, 2013.

(51) Int. Cl.
    *H01L 21/768*     (2006.01)
    *H01L 21/306*     (2006.01)
    *H01L 29/778*     (2006.01)
    *H01L 29/423*     (2006.01)
    *H01L 29/20*     (2006.01)

(52) U.S. Cl.
    CPC .... *H01L 21/76895* (2013.01); *H01L 29/7788* (2013.01); *H01L 29/7789* (2013.01); *H01L 29/2003* (2013.01); *H01L 29/4236* (2013.01)

(56) References Cited

U.S. PATENT DOCUMENTS

| | | | |
|---|---|---|---|
| 7,098,093 | B2 | 8/2006 | Clarke et al. |
| 7,308,253 | B2 | 12/2007 | Moody et al. |
| 9,490,357 | B2 | 11/2016 | Khalil et al. |
| 9,601,610 | B1 | 3/2017 | Kahlil |
| 9,799,726 | B1 | 10/2017 | Khalil |
| 2003/0190789 | A1 | 10/2003 | Salama et al. |
| 2006/0180831 | A1 | 8/2006 | Nakazawa et al. |
| 2008/0142845 | A1 | 6/2008 | Kodama et al. |
| 2009/0039421 | A1 | 2/2009 | Otake et al. |
| 2009/0057684 | A1 | 3/2009 | Otake et al. |
| 2013/0337619 | A1 | 12/2013 | Zhu |
| 2014/0159048 | A1 | 6/2014 | Huang et al. |
| 2014/0203329 | A1 | 7/2014 | Saitoh |
| 2015/0014700 | A1 | 1/2015 | Kahlil et al. |
| 2015/0021686 | A1 | 1/2015 | Shea et al. |
| 2015/0333170 | A1 | 11/2015 | Li et al. |

FOREIGN PATENT DOCUMENTS

| | | |
|---|---|---|
| JP | 05-129344 | 5/1993 |
| JP | 2009-099774 | 5/2009 |
| JP | 2009-170746 | 7/2009 |
| WO | 2012164750 A1 | 12/2012 |

OTHER PUBLICATIONS

From EPO Application No. 14826223.1, EPO Supplementary Search Report and Opinion dated Feb. 15, 2017.
From U.S. Appl. No 15/395,799 (unpublished) Application and Office Actions.
M.A Briere "Understanding The Breakdown Characteristics of Lateral GaN-Based HEMTs", How2Power Today Newsletter, pp. 1-5, (2013).
International Search Report and Written Opinion from PCT/US2014/046438 dated Oct. 21, 2014.
International Preliminary Report on Patentability (Chapter 1) from PCT/US2014/046438 dated Jan. 28, 2016.
From U.S. Appl. No. 14/329,745 (now U.S. Pat. No. 9,490,357) Restriction dated Dec. 7, 2015.
From U.S. Appl. No. 14/329,745 (now U.S. Pat. No. 9,490,357) Non Final Office Action dated Feb. 29, 2016.
From U.S. Appl. No. 14/329,745 (now U.S. Pat. No. 9,490,357) Notice of Allowance dated Jul. 8, 2016.
From U.S. Appl. No. 14/743,696 (unpublished; non-publication requested) Restriction dated Dec. 16, 2015.
From U.S. Appl. No. 14/743,696 (unpublished; non-publication requested) Non Final Rejection dated Mar. 31, 2016.
From U.S. Appl. No. 14/743,696 (unpublished; non-publication requested) Notice of Allowance dated Aug. 11, 2016.
Office action from Chinese Patent Application No. 201480031378.6 dated Feb. 11, 2018, and its English translation.
From U.S. Appl. No. 15/395,799 (now published as U.S. Pat. No. 9,799,726), Corrected Notice of Allowability dated Jul. 6, 2017.
From U.S. Appl. No. 15/395,799 (now published as U.S. Pat. No. 9,799,726), Notice of Allowance dated Jun. 16, 2017.
Office action from Chinese Patent Application No. 201480031378.6 dated Jul. 10, 2018, and its English translation.
Office action from European Patent Application No. 14826223.1 dated Mar. 27, 2019.

VERTICAL III-NITRIDE SEMICONDUCTOR DEVICE WITH A VERTICALLY FORMED TWO DIMENSIONAL ELECTRON GAS

RELATED APPLICATIONS

This application claims the benefit of and is a divisional of U.S. patent application Ser. No. 14/329,745 filed on Jul. 11, 2014, the disclosure of which is incorporated herein by reference.

FIELD OF THE INVENTION

The present invention relates generally to integrated circuits or devices having elements operating with a 2-dimension electron gas (2DEG), and relates in particular to III-Nitride high voltage vertical HEMTs operating with a 2DEG.

BACKGROUND

In known III-Nitride HEMT devices used in power applications, there exists a design trade-off between the on-state resistance and breakdown voltage (BV). Known high voltage GaN HEMT devices use a technology and process flow based on a lateral device structure where a large drift region supports the off-state voltage that extends laterally, and where a high mobility 2DEG sheet is oriented horizontally.

FIG. 1 illustrates a cross-section of a portion of a prior art high voltage HEMT 10 comprising a narrow-bandgap channel layer 12, or carrier carrying layer, for example of undoped GaAs or GaN, formed on top of a buffer structure 14 itself formed on top of a substrate 16 such as a Si substrate. A wide-bandgap carrier supplying layer 18, or barrier layer, for example a highly-doped n-type AlGaAs or AlGaN layer, is formed on top of channel layer 12. HEMT 10 comprises a channel region 20 formed in channel layer 12 between a conductive source contact region 22 and a conductive drain contact region 24 both formed through the carrier supplying layer 18 into channel layer 12. A passivation layer 26 covers carrier supplying layer 18 above the channel region 20, and a gate contact region 28, insulated by an insulator layer 30, traverses the passivation layer 26 into the carrier layer 18. Alternatively, gate contact region 28 insulated by insulator layer 30 can traverse the passivation layer 26 to come in contact with the surface of carrier layer 18. In addition, HEMT 10 comprises field plates 32, 34 attached respectively to gate contact region 28 and source contact region 22.

In HEMT 10, the drift region which extends from the edge of gate region 28 to the drain contact region is oriented horizontally with the function of supporting high drain to source and high drain to gate voltage during the off-state operation. A second important feature of HEMT 10 is the two dimensional electron gas layer 36 which forms right below the interface between the carrier supplying layer 18 (AlGaN) and the carrier carrying layer (GaN layer). This layer has a high carrier mobility that can for example reach 2100 cm2/V·sec. If the AlGaN layer thickness is increased beyond a certain value a 2DEG will form under the interface with the density of 2DEG increasing with both the thickness of the AlGaN layer and the Al mole fraction.

A horizontal 2DEG HV GaN based HEMT such as lateral HEMT 10 is considered, at the present time, to be a preferred candidate to lead the power electronics roadmap due to its superior material properties such as high critical electric field, wide band-gap and high saturation velocity as well as the ability to utilize a high density of sheet charge that can move in the 2DEG layer with high mobility. However, for higher voltage devices with ratings for example above 600V, the horizontal drift region becomes relatively large which in turn results in a larger cell pitch and higher product of on-state resistance and chip area Ron.A, where A is the area of the device chip.

The product Ron.A is an important figure of merit in power devices as it directly impacts the cost of the die. A further impact on die cost comes from a lower yield associated with larger die area which is particularly significant for lateral GaN.

While still more favorable than their Silicon counterparts, High Voltage GaN based lateral HEMTs become less attractive than vertical GaN based devices as the blocking voltage increases due to the requirement for longer drift region to support the off-state drain voltage.

In a vertical configuration (vertical power device) the cell pitch is reduced significantly because the drift region extends vertically. The lateral dimension in such structure is limited only by process constraints and punch-through breakdown considerations. This implies that the Ron.A product will be much lower for the vertical device as compared to lateral devices and this is especially true for higher voltage ratings.

FIG. 2 illustrates a cross-section of a portion of a known vertical GaN FET 40 comprising a substrate 42, for example made of N+ GaN, on top of which is arranged a drift layer 44 for example made of low doped N− GaN. The FET 40 comprises no 2DEG. A channel layer 46, for example of undoped GaN, is arranged on top of drift layer 44 and is covered by a source contact region 48. Source contact region 48 and channel region 46 are traversed by a gate trench 50 that extends into drift region 44. A gate insulator layer 52 lines the gate trench 50 and a gate contact region 54 fills up the space left in the gate trench by the gate insulator layer 52. A drain electrode 56 is arranged on the bottom surface of substrate 42; source and gate electrodes contact the source and gate contact regions, on the top surface of FET 40. FET 40 comprises a drift region 58 that extends vertically in the drift layer 44, whereby current conduction in FET 40 is vertical and the voltage across the device in the off-state is supported across the vertically-oriented drift region.

The vertical configuration of FET 40 translates into a significant reduction of the cell pitch for a transistor having a high voltage rating. The cell pitch for a vertical device such as FET 40 is mainly determined by photolithography, process constrains to implement the vertical structure and punch through considerations. For a given technology maturity level of a vertical power device such as GaN FET 40 and lateral power device such as Gan HEMT 10, a breakeven point of the voltage rating in terms of value proposition is set. Below the breakeven point, the lateral configuration makes more business sense and above it the vertical configuration is more favorable. The breakeven point can be determined by the drift region length (which is design related), cell pitch, cost of starting material in addition to process complexity and mask count of each of the two configurations.

Known vertical GaN-based devices rely on bulk GaN drift region in which the high electron density and high mobility layers are absent. Bulk GaN devices rely on bulk mobility, which is considerably lower than the 2DEG mobility. The inventors have noted that for high voltage devices with voltage ratings larger than 600V, vertical GaN HEMTs would often be preferable compared to lateral GaN HEMT and Vertical bulk GaN.

Furukawa U.S. Pat. No. 7,038,253 B2 issued on May 2, 2006 discloses a GaN-based field effect transistor of a normally-off type, which has an extremely small ON resistance during operation and is capable of a large-current operation, which comprises source and drain electrodes; a channel portion made of a first GaN-based semiconducting material that is an i-GaN-based semiconducting material or a p-GaN-based semiconducting material. The channel portion is so formed as to be electrically connected to the source and drain electrodes. First and second electron supply portions made of a second GaN-based semiconducting material have greater bandgap energy than the first GaN-based semiconducting material, the first and second electron supply portions being joined to the channel portion and located separately from each other. An insulating layer, formed on the surface of the channel portion, spreads between the first and second electron supply portions; and a gate electrode is disposed on the insulating layer.

Rohm Co. U.S. Patent Application Publication US 2009/0057684 to Hirotaka entitled "Nitride Semiconductor Device and Method for Producing Nitride Semiconductor Device" discloses a Nitride semiconductor device that includes: a semiconductor base layer made of a conductive group III-Nitride semiconductor having a principal plane defined by a nonpolar plane or a semipolar plane; an insulating layer formed on the principal plane of the semiconductor base layer with an aperture partially exposing the principal plane; a Nitride semiconductor multilayer structure portion, formed on a region extending onto the insulating layer from the aperture, having a parallel surface parallel to the principal plane of the semiconductor base layer as well as a +c-axis side first inclined surface and a −c-axis side second inclined surface inclined with respect to the principal plane of the semiconductor base layer and including two types of group III Nitride semiconductor layers at least having different lattice constants; a gate electrode formed to be opposed to the second inclined surface; a source electrode arranged to be electrically connected with the group III Nitride semiconductor layers; and a drain electrode formed on a back surface of the semiconductor base layer opposite to the principal plane.

U.S. Pat. No. 7,098,093 to Clarke discloses a HEMT type device which has pillars with vertical walls perpendicular to a substrate. The pillars are of an insulating semiconductor material such as GaN. Disposed on the side surfaces of the pillars is a barrier layer of a semiconductor material such as AlGaN having a bandgap greater than that of the insulating material of the pillars. Electron flow is confined to a narrow channel at the interface of the two materials. Suitable source, drain and gate contacts are included for HEMT operation.

SUMMARY

The present disclosure relates to the structure of a vertical HEMT wherein at least a portion of the drift region between the gate and the drain relies on 2DEG mobility, as well as to methods for manufacturing such a vertical HEMT.

An embodiment of the present disclosure relates to a HEMT device comprising: a III-Nitride material substrate, the surface of which follows a plane that is not parallel to the C-plane of the III-Nitride material; an epitaxial layer of III-Nitride material grown on said substrate; a recess etched in said epitaxial layer, the recess having at least one plane wall that is not parallel to the surface of the substrate; said at least one plane wall being parallel to a polar plane of the III-Nitride material; at least one carrier supply layer formed on at least a portion of said at least one plane wall of the recess, such that a 2DEG region is formed along said at least a portion of said at least one plane wall of the recess; a doped source region formed at the surface of said epitaxial layer such that the doped source region is separated from said 2DEG region by a channel region of the epitaxial layer; a gate insulating layer formed on the channel region of the epitaxial layer; and a gate contact layer formed on the gate insulating layer.

According to an embodiment of the present disclosure, the gate and channel regions extend parallel to the surface of the substrate.

According to an embodiment of the present disclosure, the gate and channel regions extend parallel to said at least one plane wall of the recess.

According to an embodiment of the present disclosure, said at least one carrier supply layer is formed on a portion of said at least one plane wall of the recess such that a further 2DEG region is formed along the channel region of the epitaxial layer.

According to an embodiment of the present disclosure, said at least one plane wall of the recess is parallel to the C-plane of the III-Nitride material.

According to an embodiment of the present disclosure, at least one plane wall of the recess is perpendicular to the surface of the substrate.

According to an embodiment of the present disclosure, the surface of the substrate follows the M-plane of the III-Nitride material.

According to an embodiment of the present disclosure, the surface of the substrate follows the A plane of the III-Nitride material.

According to an embodiment of the present disclosure, the III-Nitride material substrate is a free standing III-Nitride material substrate.

According to an embodiment of the present disclosure, the III-Nitride material is GaN.

According to an embodiment of the present disclosure, the carrier supply layer comprises one of an epitaxial single crystal AlGaN, an epitaxial single crystal GaN/AlGaN and an epitaxial single crystal AlN.

According to an embodiment of the present disclosure, the carrier supply layer comprises a spacer layer formed on the III-Nitride material epitaxial layer and a barrier layer formed on the spacer layer.

According to an embodiment of the present disclosure, the carrier supply layer is grown on the III-Nitride material epitaxial layer such that the 2DEG region is formed in the epitaxial III-Nitride material along the surface of said at least a portion of said at least one plane wall of the recess.

An embodiment of the present disclosure relates to a method for making a HEMT device, the method comprising: providing a III-Nitride material substrate, the surface of which follows a plane that is not parallel to the C-plane of the III-Nitride material; growing an epitaxial layer of III-Nitride material on said substrate; etching in said epitaxial layer a recess having at least one plane wall that is not parallel to the surface of the substrate; said at least one plane wall being parallel to a polar plane of the III-Nitride material; forming on at least a portion of said at least one plane wall of the recess at least a carrier supply layer such that a 2DEG region is formed along the surface of said at least a portion of said at least one plane wall of the recess; forming a doped source region at the surface of said epitaxial layer, such that the doped source region is separated from said 2DEG region by a channel region of the epitaxial layer;

forming a gate insulating layer on the channel region of the epitaxial layer; and forming a gate contact layer on the gate insulating layer.

According to an embodiment of the present disclosure, the gate and channel regions extend parallel to the surface of the substrate.

According to an embodiment of the present disclosure, the gate and channel regions extend parallel to said at least one plane wall of the recess.

According to an embodiment of the present disclosure, said at least one carrier supply layer is arranged on a portion of said at least one plane wall of the recess such that a further 2DEG region is formed along the channel region of the epitaxial layer.

According to an embodiment of the present disclosure, said least one plane wall is parallel to the C-plane of the III-Nitride material.

According to an embodiment of the present disclosure, said at least one plane wall of the recess is perpendicular to the surface of the substrate.

According to an embodiment of the present disclosure, the surface of the substrate follows the M-plane of the III-Nitride material.

According to an embodiment of the present disclosure, the surface of the substrate follows the A plane of the III-Nitride material.

According to an embodiment of the present disclosure, the III-Nitride material substrate is a free standing III-Nitride material substrate.

According to an embodiment of the present disclosure, the III-Nitride material is GaN.

According to an embodiment of the present disclosure, the carrier supply layer comprises one of an epitaxial single crystal AlGaN, an epitaxial single crystal GaN/AlGaN and an epitaxial single crystal AlN.

According to an embodiment of the present disclosure, forming the carrier supply layer comprises forming a spacer layer on the III-Nitride material epitaxial layer and forming a barrier layer on the spacer layer.

According to an embodiment of the present disclosure, forming said at least a carrier supply layer on at least a portion of said at least one plane wall of the recess comprises growing the carrier supply layer on the III-Nitride material epitaxial layer such that a 2DEG is formed in the epitaxial III-Nitride material along the surface of said at least a portion of said at least one plane wall of the recess.

BRIEF DESCRIPTION OF THE DRAWINGS

The invention(s) may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 3A:
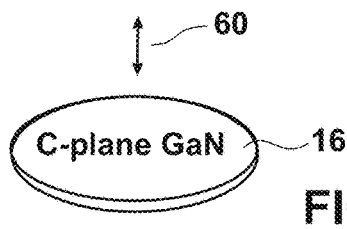
FIGS. 3a and 3B illustrate a wafer of a C-plane substrate of a III-Nitride material as well as a 2DEG formed on said C-plane substrate.
Figure 3B:
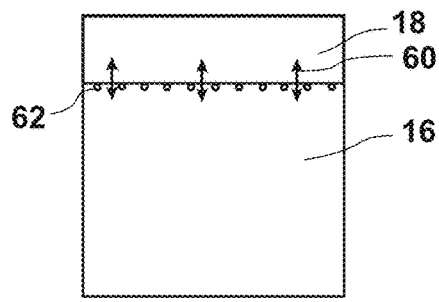

FIG. 3a illustrates a wafer of a C-plane substrate 16 of a III-Nitride material, for example GaN. The crystalline structure of the III-Nitride material is such that its C-plane is polar; i.e. exhibits noticeable spontaneous and piezoelectric polarization effects in a direction perpendicular to its surface. As illustrated in FIG. 3B, the resulting polarization field 60 can result in a two-dimensional carrier confinement, also known as 2DEG, 62 along the surface of substrate 16 if a barrier layer or carrier supplying layer 18 is formed on top of said surface.

Figure 4:
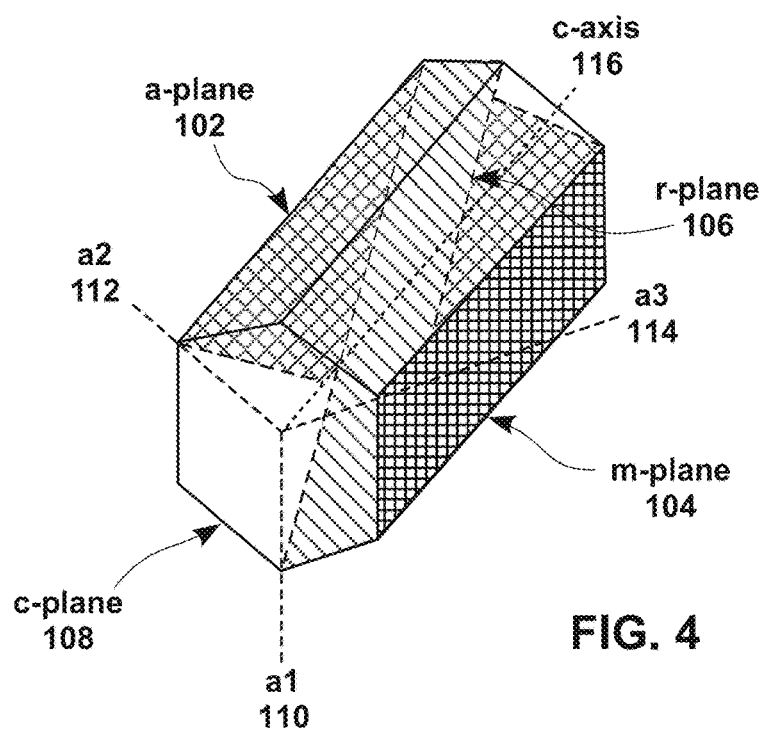
FIG. 4 is a projection view of a crystal of a III-Nitride material.

FIG. 4 is a projection view of a crystal of a III-Nitride material such as GaN, showing in particular that the III-Nitride material comprises two non-polar planes: the M-plane and the A-plane, which are perpendicular to each other and also perpendicular to the polar, C-plane.

According to an embodiment of the present disclosure, the III-Nitride substrate is preferably configured such that the surface of the substrate is parallel to the M-plane or the A-plane of the III-Nitride material. As disclosed hereafter, such configuration allows forming in the substrate vertical trenches (trenches normal to the surface) having trench walls parallel to the C-plane of the III-Nitride material. This allows forming a dense 2DEG along the trench walls.

However, according to embodiments of the present disclosure, the III-Nitride substrate can also be configured such that the surface of the substrate makes an angle (different from 90 degree) with respect to the M-plane or the A-plane of the III-Nitride material. Such configuration allows forming in the substrate vertical trenches having trench walls not normal to the C-plane of the III-Nitride material, which allows forming along the trench walls a 2DEG of reduced density due to the angle between the trench walls and the C-plane.

Figure 5A:
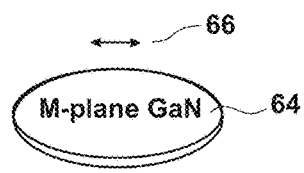
FIGS. 5A and 5B illustrate a wafer of a M-plane substrate of a III-Nitride material as well as a 2DEG formed on said M-plane substrate according to embodiments of the present disclosure.

FIG. 5A illustrates a wafer of a M-plane III-Nitride substrate 64 according to an embodiment of the present disclosure. The crystalline structure of the III/Nitride substrate 64 is such that its M-plane is non-polar; the polarization field 66 of the III-Nitride substrate 64 being internal and parallel to the surface of the III-Nitride substrate 64.

Figure 5B:
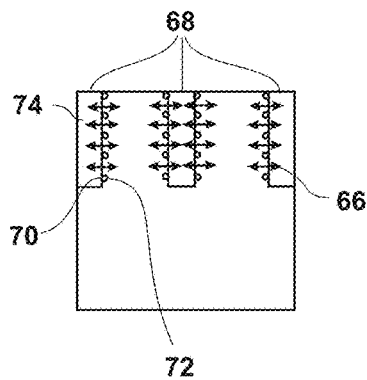

FIG. 5B illustrates a plurality of recesses 68 etched in the III-Nitride substrate 64. According to an embodiment of the present disclosure, each recess 68 comprises at least one plane wall 70 that is perpendicular to the surface of the III-Nitride substrate 64, and that is parallel to the C-plane of the III-Nitride material. The polarization field 66 present at the surface of plane wall 70 is then perpendicular to the surface of plane wall 70. According to an embodiment of the present disclosure, the polarization field 66 present at the surface of plane wall 70 can result in a two-dimensional carrier confinement, or 2DEG, 72 in the III-Nitride substrate 64 along the surface of plane wall 70 if a carrier supply layer 74 is formed on the surface of plane wall 70.

According to an alternative embodiment of the present disclosure, each recess 68 can comprise a plane wall 70 that is not normal to the surface of the III-Nitride substrate 64, and that makes an angle with respect to the C-plane of the III-Nitride material. The polarization field 66 present at the surface of plane wall 70 is then not perpendicular to the surface of plane wall 70, which results in 2DEG 72 of reduced density in the III-Nitride substrate 64 along the surface of plane wall 70 if a carrier supply layer 74 is formed on the surface of plane wall 70.

Figure 6:
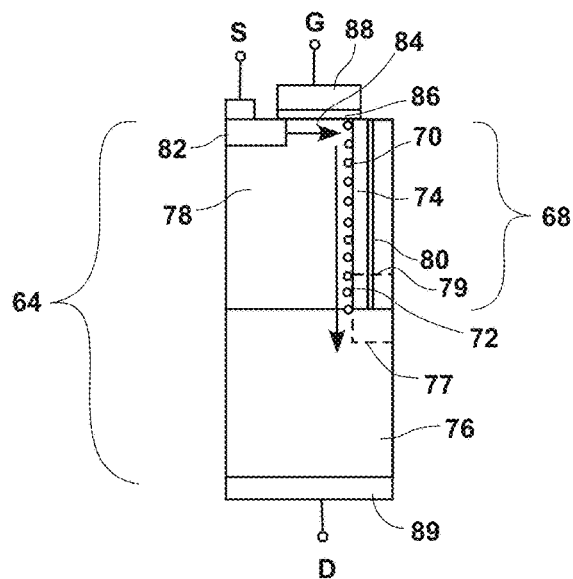
FIGS. 6 and 6A illustrate a cross-section of a portion of a high voltage vertical HEMT according to embodiments of the present disclosure.

FIG. 6 illustrates a cross-section of a portion of a high voltage vertical HEMT 75 according to an embodiment of the present disclosure, wherein the III-Nitride substrate 64 comprises a free standing bulk III-Nitride material substrate 76 and an epitaxial layer 78 of III-Nitride material grown on substrate 76. For clarity, the polarization field 66 of substrate 64 is not illustrated in the present figure. According to an embodiment of the present disclosure, the polarization field 66 is perpendicular to the surface of plane wall 70 as shown in FIG. 5B. According to an embodiment of the present disclosure, the surface of III-Nitride substrate 76 follows a plane that is not parallel to the C-plane of the III-Nitride material. For example, III-Nitride Nitride substrate 76 can be an n+ M-plane free standing GaN substrate. The epitaxial growth of layer 78 on a bulk substrate of a same material ensures that epitaxial layer 78 has a similar crystallographic arrangement as III-Nitride substrate 76. According to an embodiment of the present disclosure, epitaxial layer 78 can be made of unintentionally doped material. For example, where the III-Nitride substrate 76 is an n+ M-plane free standing GaN substrate, epitaxial layer 78 can be an un-intentionally doped n-GaN epitaxial layer that has a similar m-plan crystallographic arrangement as III-Nitride substrate 76.

According to an embodiment of the present disclosure as shown in FIG. 6, HEMT 75 comprises at least one recess 68 etched in epitaxial layer 78. According to an embodiment of the present disclosure, recess 68 can be a vertical trench that extends through epitaxial layer 78 but stops at the interface between epitaxial layer 78 and III-Nitride substrate 76, as shown in solid lines in FIG. 6. According to an embodiment of the present disclosure, recess 68 can be a trench that extends through epitaxial layer 78 and penetrates III-Nitride substrate 76, as shown in dashed lines with the reference 77 in FIG. 6. According to an embodiment of the present disclosure, recess 68 can be a trench that extends into epitaxial layer 78 without reaching III-Nitride substrate 76, as shown in dashed lines with the reference 79 in FIG. 6.

According to an embodiment of the present disclosure, recess 68 comprises at least one plane wall 70 that is not parallel to the surface of the III-Nitride substrate 76. According to an embodiment of the present disclosure, plane wall 70 is parallel to a polar plane of the III-Nitride material. Where III-Nitride substrate 76 is an M-plane substrate and recess 68 is a vertical trench, plane wall 70 can be parallel to the C-plane of the material of III-Nitride substrate 76 and epitaxial layer 78. According to an embodiment of the present disclosure, a carrier supplying layer 74 is grown on at least a portion of plane wall 70 of recess 68, such that a 2DEG region 72 is formed in the epitaxial III-Nitride material of epitaxial layer 78 along the surface of plane wall 70 that is covered by carrier supply layer 74. In the embodiment illustrated in FIG. 6, carrier supply layer 74 covers completely plane wall 70, so that 2DEG region 72 extends along the entire plane wall 70. According to an embodiment of the present disclosure, a passivation layer 80 can be formed on carrier supply layer 74.

According to an embodiment of the present disclosure, carrier supply layer 74 can be an epitaxial single crystal AlGaN, an epitaxial single crystal GaN/AlGaN or an epitaxial single crystal AlN.

According to an embodiment of the present disclosure, as shown in FIG. 6, HEMT 75 comprises a doped source region 82 formed at the surface of epitaxial layer 78, for example by doping a region of the surface of epitaxial layer 78 extending parallel to the surface of substrate 76, such that the doped source region 82 is separated from the 2DEG region 72 by a channel region 84 of epitaxial layer 78. According to an embodiment of the present disclosure, channel region 84 also extends parallel to the surface of substrate 76. According to an embodiment of the present disclosure, HEMT 75 comprises a gate insulating layer 86 formed on the channel region 84 of the epitaxial layer 78, and a gate contact layer 88 formed on the gate insulating layer 86. According to an embodiment of the present disclosure, the gate insulating layer 86 and gate contact layer 88 cover a portion of the source region 82 and a portion of carrier supply layer 74. According to an embodiment of the present disclosure, HEMT 75 comprises a drain contact region 89 on the bottom surface of substrate 76. At least a portion of the drift region of HEMT 75 comprises 2DEG region 72.

According to an embodiment of the present disclosure, HEMT 75 operates as follows: During the on-state operation, a gate voltage (VG) is applied to the gate contact layer 88 by a gate electrode, where VG> pinch off voltage (Vp) of the device. A channel is formed under the gate contact layer 88 in channel region 84 if VG is sufficiently larger than Vp. The channel formed in channel region 84 under the gate contact layer 88 provides a low resistive path for carriers to flow from the source region 82 to the 2DEG region 72. The initial current flow in HEMT 75 is lateral, under the gate contact layer 88, then vertical in the 2DEG region 72 where carriers flow with high mobility towards substrate 76, and finally flow out of the drain contact region 89.

During the off-state, a gate voltage is applied to the gate electrode where VG<Vp (more negative than the pinch off voltage). No channel is formed between the source region 82 and the 2DEG region 72. The positive drain voltage across the drift region is then supported by a depleted 2DEG region which is similar to the case of the conventional lateral HEMT. According to an embodiment of the present disclosure, the thickness of the grown epitaxial layer 78 is designed to support the full drain voltage, i.e. the device drift region length LD is roughly equal to the thickness of layer 78.

Figure 6A:
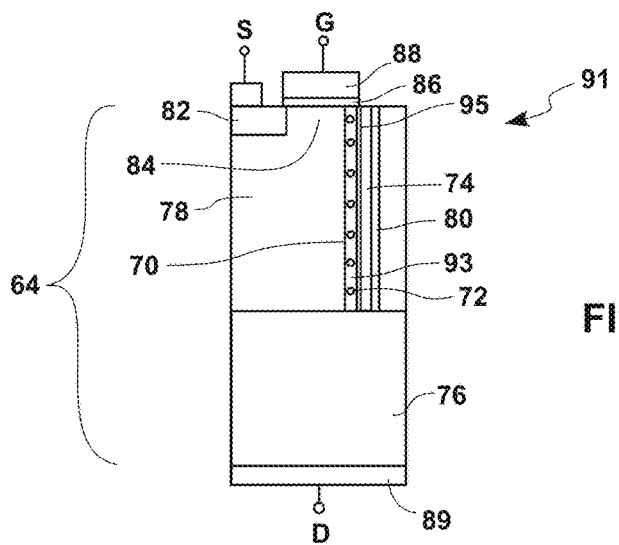

FIG. 6A illustrates a cross-section of a portion of a high voltage vertical HEMT 91 according to an embodiment of the present disclosure, essentially identical to high voltage vertical HEMT 75 of FIG. 6, but wherein in addition an intermediate carrier carrying layer 93 was grown on the surface of plane wall 70, before growing carrier supply layer 74 on the carrier carrying layer 93, such that the 2DEG region 72 is formed in the intermediate carrier carrying layer 93. Such intermediate carrier carrying layer 93 can be of the same material as epitaxial layer 78. Carrier carrying layer 93 can for example be grown to provide an interface with the carrier supply layer 74 having a lower defect density than if no intermediate carrier carrying layer 93 were used. According to an embodiment of the present disclosure, a spacer layer 95 can optionally be formed prior to the carrier supply layer 74, the carrier supply layer 74 being subsequently grown on the spacer layer. The spacer layer 95 can for example be made of AlN if the carrier supply layer 74 is made of AlGaN, for example to prevent alloy disorder effect at the interface between the carrier supply layer 74 and the intermediate carrier carrying layer 93. According to an embodiment of the present disclosure, spacer layer 95 can also be formed in HEMT 75 to prevent alloy disorder effect at the interface between the carrier supply layer 74 and the epitaxial layer 78.

Figure 7:
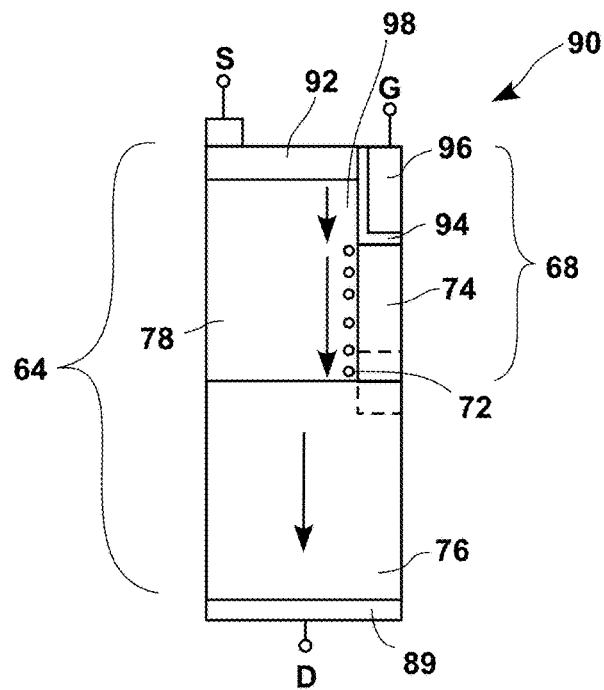
FIGS. 7 and 7A illustrate a cross-section of a portion of a high voltage vertical trench HEMT according to embodiments of the present disclosure.

FIG. 7 illustrates a cross-section of a portion of a high voltage vertical HEMT, or trench HEMT, 90 according to an embodiment of the present disclosure, made in a III-Nitride substrate 64 that comprises a free standing bulk III-Nitride material substrate 76 and an epitaxial layer 78 of III-Nitride material grown on substrate 76 as described previously in relation with FIG. 6. According to an embodiment of the present disclosure, HEMT 90 comprises at least one recess 68 etched in epitaxial layer 78 as described previously in relation with FIG. 6. For clarity, the polarization field 66 of substrate 64 is not illustrated in the present figure. According to an embodiment of the present disclosure, the polarization field 66 is perpendicular to the surface of plane wall 70 as shown in FIG. 5.

According to an embodiment of the present disclosure, a carrier supply layer 74 is grown on a portion of plane wall 70 of recess 68, such that a 2DEG region 72 is formed in epitaxial layer 78 along said portion of plane wall 70.

According to an embodiment of the present disclosure, carrier supply layer 74 can be an epitaxial single crystal AlGaN, an epitaxial single crystal GaN/AlGaN or an epitaxial single crystal AlN.

According to an embodiment of the present disclosure, HEMT 90 comprises a doped source region 92 formed at the surface of epitaxial layer 78, for example by doping a region of the surface of epitaxial layer 78, and extending parallel to the surface of substrate 76 up to the edge of recess 68. According to an embodiment of the present disclosure, HEMT 90 comprises a gate insulating layer 94 formed on the portions of plane wall 70 not covered by carrier supply layer 74. The insulating layer can also be covering the top surface of carrier supply layer 74 in recess 68. According to an embodiment of the present disclosure, HEMT 90 comprises a gate contact layer 96 formed in recess 68 on the gate insulating layer 94, thus forming a vertical channel region 98 in epitaxial layer 78 below source region 92 along gate contact layer 96. According to an embodiment of the present disclosure, HEMT 90 comprises a drain contact region 89 on the bottom surface of substrate 76. At least a portion of the drift region of HEMT 90 comprises 2DEG region 72.

According to an embodiment of the present disclosure, HEMT 90 operates substantially as HEMT 75, except that in on-state operation a vertical channel is formed along the gate contact layer 96 in channel region 98 if VG (voltage of the gate) is sufficiently larger than Vp (pinch off voltage of HEMT 90), which provides a low resistive path for carriers to flow from the source region 92 to the 2DEG region 72. The current flow in HEMT 90 is vertical along the gate contact layer 96, then vertical in the 2DEG region 72 where carriers flow high mobility towards substrate 76, and finally flow out of the drain contact region 89.

During the off-state, a gate voltage is applied to the gate electrode where VG<Vp (more negative than the pinch off voltage). No channel is formed between the source region 92 and the 2DEG region 72. The positive drain voltage across the drift is then supported by a depleted 2DEG region which is similar to the case of the conventional lateral HEMT. According to an embodiment of the present disclosure, the thickness of the grown epitaxial layer 78 is designed to support the full drain voltage, i.e. the device drift region length LD is roughly equal to the thickness of layer 78.

Figure 7A:
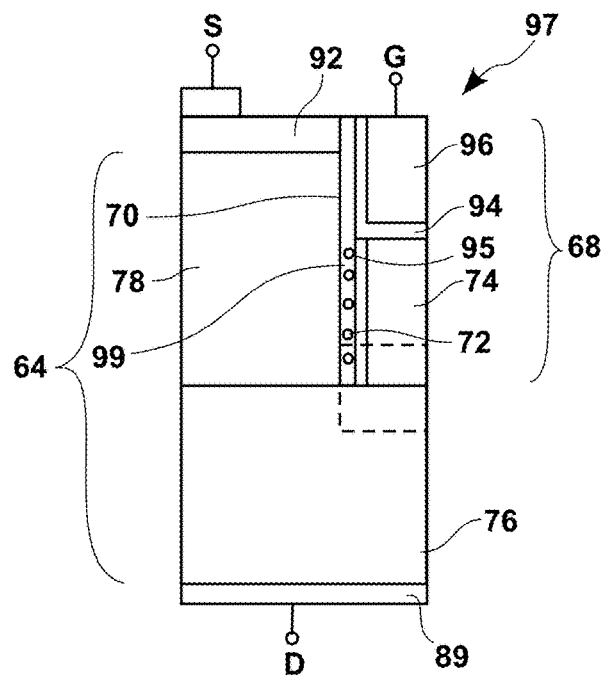

FIG. 7A illustrates a cross-section of a portion of a high voltage vertical HEMT 97 according to an embodiment of the present disclosure, essentially identical to high voltage vertical HEMT 90 of FIG. 7, but wherein in addition an intermediate carrier carrying layer 99 was grown on the surface of plane wall 70, before growing carrier supply layer 74 on a bottom portion of the carrier carrying layer 99. In HEMT 97, the 2DEG region 72 is formed in the intermediate carrier carrying layer 99 along the carrier supply layer 74. Such intermediate carrier carrying layer 99 can be of the same material as epitaxial layer 78. Intermediate carrier carrying layer 99 can be grown to provide an interface with the carrier supply layer 74 having a lower defect density than if no intermediate carrier carrying layer were used. According to an embodiment of the present disclosure, a spacer layer 95 similar to the one described in relation with FIG. 6A can be formed prior to the carrier supply layer 74, the carrier supply layer 74 being subsequently grown on the spacer layer 95.

According to an embodiment of the present disclosure, the following process flow can be used to manufacture one of HEMTs 75, 90, 91, or 97:

A n+ M-plane free standing GaN substrate 76 is provided, that acts as a highly doped drain region and provides a template to grow a layer of an un-intentionally doped GaN layer 78 on which the rest of the device structure is implemented. Because the un-intentionally doped (UID) GaN layer 78 is grown on top of the n+ M-plane GaN substrate 76, it has a similar m-plan crystallographic arrangement.

At least one trench 68 is then etched, for example perpendicular to the substrate plane, in the UID GaN layer 78, and extends vertically from the surface of layer 78 to the n+ substrate 76. This trench might or might not extend deep enough to reach the n+ substrate 76. Depending on device optimization, the trench might penetrate the n+ substrate 76, or stop at the n+ substrate/UID interface or even stop before reaching that interface. The trench has at least one sidewall 70.

Figure 1:
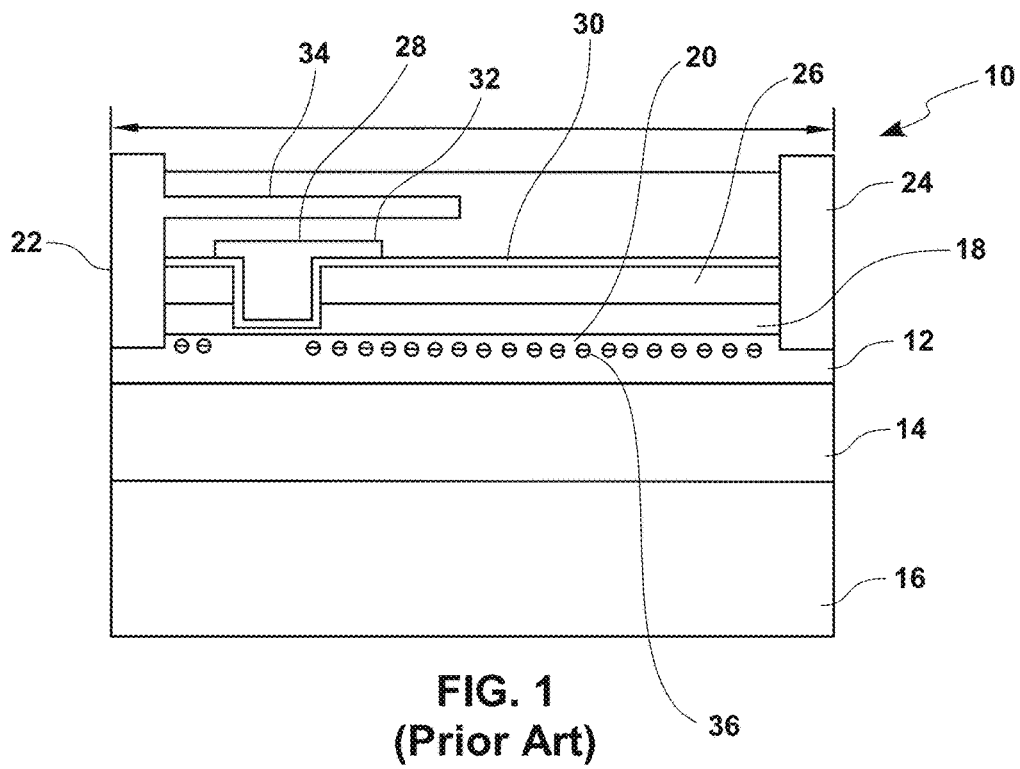
FIG. 1 illustrates a cross-section of a portion of a prior art high voltage lateral HEMT.
Figure 2:
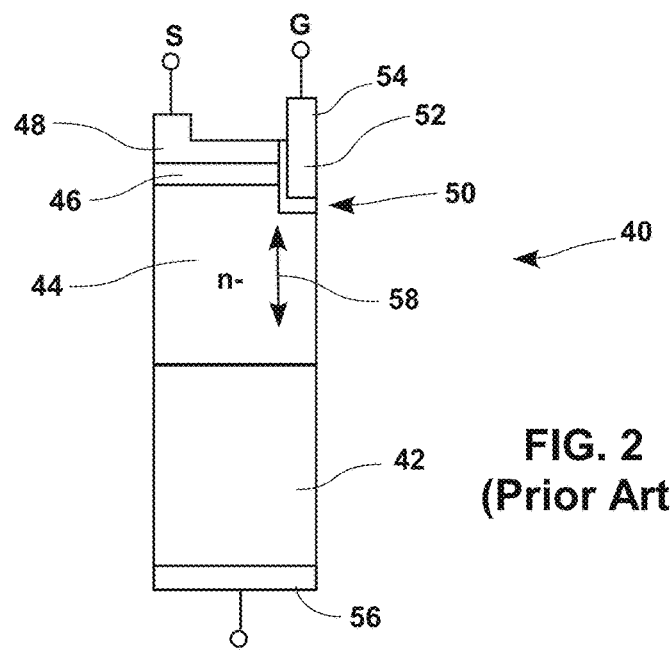
FIG. 2 illustrates a cross-section of a portion of a prior art high voltage vertical FET.

Within trench 68, which can be formed by one of the known methods to form high aspect ratio trenches such as reactive ion etching, a III-Nitride layer 74 (or layers) is (are) grown on sidewall 70, that will ultimately have the function of forming a vertical heteroepitaxial junction. The composition and growth conditions of these heteroepitaxial junction layer(s) are provided to set the correct conditions for both spontaneous and piezoelectric polarization in a way similar to that of the current supplying layer (typically AlGaN barrier) set the spontaneous and piezoelectric polarization in the conventional lateral HEMT structure of FIG. 1.

According to embodiments of the present disclosure, heteroepitaxial junction layer(s) can be composed of any number of layers—for example their growth can involve only the regrowth of an AlGaN layer to form a heterostructure with the sidewall 70. In another embodiment the heteroepitaxial junction layer(s) can be made of GaN/AlGaN grown on the sidewall 70 so that the regrown GaN layer in the GaN/AlGaN stack would have a better quality with lower defect density. In another embodiment the heteroepitaxial junction layer(s) can be a lateral stack of GaN/AlN/AlGaN. According to embodiments of the present disclosure, heteroepitaxial junction layer(s) can be any combination of layers, or a single layer of III-Nitride materials, that will result in a vertically oriented heteroepitaxial junction with high quality interface and least defect density and that will enable the formation of the required vertical 2DEG region 72 at the heteroepitaxial interface Regardless of which layer or layers will be used in the step of forming the heteroepitaxial junction layer(s), the end result is to achieve high quality regrown material with low defect density, high mobility of 2DEG and sufficiently high 2DEG density. For example, a 2DEG density of 5e12 to 1e13/cm2 can be considered as sufficiently high.

After the growth of the III-Nitride heteroepitaxial junction layer(s) is completed, a deposition or a regrowth of a suitable passivation layer 80 to terminate the regrown layers can be done, as illustrated in FIG. 6. PECVD, LPCVD or MOCVD Nitride (Si3N4) are all suitable candidates for the passivation step of forming passivation layer 80, however, the disclosure should not be limited to any of these materials and any appropriate passivation material that will have high immunity to current collapse (drain lag) issues will be suitable.

Thereafter a low Ohmic contact region is formed to implement source contact 82 or 92. A masked high dose ion implantation of donor type species such as Silicon followed by an RTA step can be used for source contact formation. Next, an insulating material is deposited or grown on the surface of epitaxial layer 78 or on a portion of sidewall 70 to form the gate dielectric 86 or 94. The insulating gate process is then followed by the deposition/evaporation with an appropriate gate material (or gate stack) 88 or 96. Back-end of line processes which include intermetallic dielectric deposition and metal evaporation or sputtering processes are done next to implement a low resistive source, drain interconnect network. It should be noted that in this vertical structure the drain metal is deposited at the back side of the wafer. To reduce the drain parasitic resistance, the n+ m– plan substrate 76 can be thinned to an appropriate thickness before depositing the backside drain metal 89.

Figure 8:
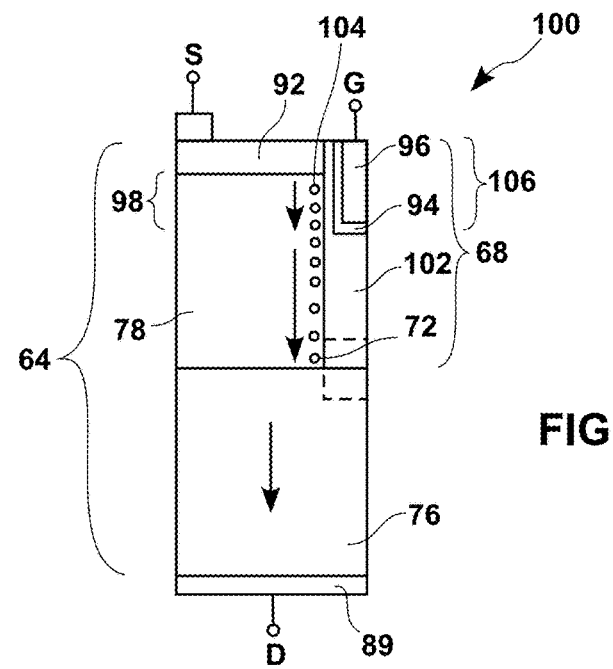
FIGS. 8 and 8A illustrate a cross-section of a portion of a high voltage vertical trench HEMT according to embodiments of the present disclosure.

FIG. 8 illustrates a cross-section of a portion of a high voltage vertical trench HEMT 100 according to an embodiment of the present disclosure. HEMT 100 is substantially identical to HEMT 90 described in relation with FIG. 7, except that instead of comprising a carrier supply layer 74 grown only on a bottom portion of plane wall 70, HEMT 100 comprises a carrier supply layer 102 grown on a larger portion of plane wall 70 such that a further 2DEG region 104 is formed along the channel region 98 of the epitaxial layer, for example in line with 2DEG region 72. For clarity, the polarization field 66 of substrate 64 is not illustrated in the present figure. According to an embodiment of the present disclosure, the polarization field 66 is perpendicular to the surface of plane wall 70 as shown in FIG. 5.

According to an embodiment of the present disclosure, carrier supply layer 102 comprises a surface recess 106 in which gate insulating layer 94 and gate contact layer 96 are formed so as to have a vertical channel region 98 as detailed in relation with FIG. 7. It is noted that, due to the further 2DEG region 104 in the channel region 98, HEMT 100 operates in a depletion mode instead of in an enhancement mode as HEMT 90.

Figure 8A:
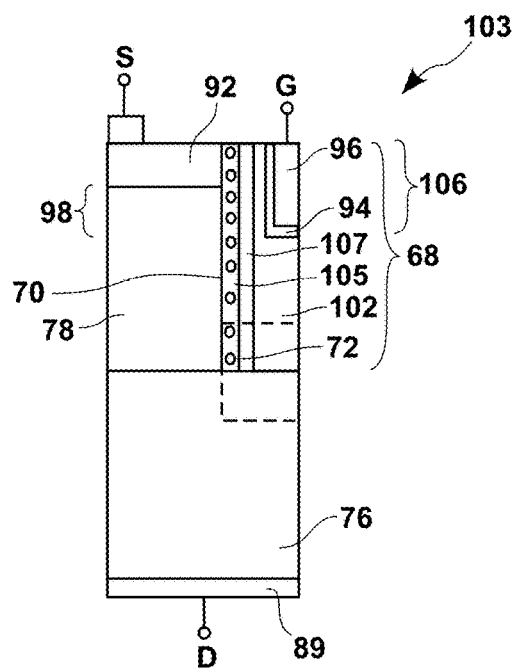

FIG. 8A illustrates a cross-section of a portion of a high voltage vertical HEMT 103 according to an embodiment of the present disclosure, essentially identical to high voltage vertical HEMT 100 of FIG. 8, but wherein in addition an intermediate carrier carrying layer 105 was grown on the surface of plane wall 70, before growing carrier supply layer 102 on the carrier carrying layer 105, such that the 2DEG region 72 is formed in the intermediate carrier carrying layer 105 along the carrier supply layer 102. Intermediate carrier carrying layer 105 can be of the same material as the epitaxial layer 78. Intermediate carrier carrying layer 105 can be grown to provide an interface with the carrier supply layer 102 having a defect density lower than if no intermediate carrier carrying layer 105 were used. According to an embodiment of the present disclosure, a spacer layer 107 (similar to the spacer layer 95 described previously) can be formed prior to the carrier supply layer 102, the carrier supply layer 102 being subsequently grown on the spacer layer 107.

The present disclosure relates to the following concepts:

Concept 1. A semiconductor device comprising a vertically Oriented 2DEG layer, comprising: a bulk M-plane free standing III-Nitride material substrate (non polar); an M-plane III-Nitride material Epi layer grown on said bulk M-plane III-Nitride material substrate; a trench etched along a polar C-plane of said M-plane III-Nitride material Epi layer; a 2DEG formed vertically alongside the trench using selective epitaxial regrowth of a single crystal AlGaN (or GaN/AlGaN).

Concept 2. The semiconductor device of concept 1, wherein the III-Nitride material is GaN.

Concept 3. The semiconductor device of concept 1, comprising a channel and a gate that extend horizontally.

Concept 4. The semiconductor device of concept 1, comprising a channel and a gate that extend vertically.

Concept 5. A method for making an semiconductor device having a vertically oriented 2DEG layer, comprising: providing an n+ M-plane free standing GaN substrate; growing an un-intentionally doped GaN epitaxial layer on top of the n+ M-plane GaN substrate so that the UID epitaxial GaN layer has a similar m-plan crystallographic arrangement; etching a trench in the UID epitaxial GaN layer that extends vertically along the c-plane from the surface of the UID epitaxial GaN layer toward the n+ substrate; forming within the trench a regrowth of at least one III-Nitride layer; depositing or regrowing a suitable passivation layer to terminate the regrown layers; forming a low Ohmic contact region to implement a source contact; depositing or growing an insulating material on the surface of the stack to form a gate dielectric; depositing an appropriate gate material on top of the gate dielectric such that the gate material overlaps both the n+ source region and the interface between the UID epitaxial GaN layer and the regrowth of at least one III-Nitride layer along a wall of the trench.

Concept 6: The method of concept 5, wherein the trench extends deep enough to penetrate the n+ substrate.

Concept 7: The method of concept 5, wherein the trench extends deep enough to stop at the n+ substrate/UID interface.

Concept 8: The method of concept 5, wherein the trench does not reach the n+ substrate/UID interface.

Concept 9: The method of concept 5, wherein the regrowth comprises an AlGaN layer to form a heterostructure with the sidewall of the n-GaN.

Concept 10: The method of concept 5, wherein the regrowth comprises GaN/AlGaN grown on the sidewall of the n-GaN region so that the regrown GaN layer in the GaN/AlGaN stack would have a better quality with lower defect density.

Concept 11: The method of concept 5, wherein the regrowth comprises a lateral stack of GaN/AlN/AlGaN.

Concept 12: The method of concept 5, wherein the passivation step comprises one of PECVD, LPCVD or MOCVD Nitride (Si3N4).

Concept 13: The method of concept 5, wherein a masked high dose ion implantation of donor type species such as Silicon followed by an RTA step is used for source contact formation. Alternatively, a patterned region is etched in the source region and selective Epitaxial regrowth of n+_GaN is used for source contact formation.

Concept 14: The method of concept 5, further comprising forming a drain contact on the bottom surface of the substrate.

It is noted that a HEMT according to the present disclosure improves greatly the scalability to high currents carrying capability as compared to the known, lateral, HEMTs as a result of cell pitch reduction. Indeed, scaling to higher currents capability in lateral GaN HEMTs is a non-trivial issue due to the coupling of current capability, defect density and blocking capability. It follows that a large area device is not capable of supporting high breakdown voltage that a smaller area device according to embodiments of the present disclosure is able to support, with identical design rules/technology.

It is noted that a HEMT according to embodiments of the present disclosure will be suitable for High Voltage GaN device applications including Electrical Vehicles, Trucks, Traction application, HV transmission lines and naval applications where high efficient power switches are required. The total available market of discrete power devices is expected to reach $ 20 Billion by 2020. The HV market in which HV GaN HEMT can target is estimated at $ 8 Billion by 2020. The insertion of GaN based power devices in the aforementioned applications is of significant interest to car manufacturers, as well as energy and defense industries, due to the superior material properties of GaN HEMTs. Further, GaN based power devices are considered to be the main candidate to lead future roadmaps of energy efficient products. HEMTs according to the present disclosure are particularly useful in applications that require 1300V blocking capability, for example for the electrification of next generation vehicles. The global requirement for CO2 emission reduction and the drive in the U.S. to reduce dependence on foreign oil are driving the market pull for energy efficient semiconductor devices that are superior in performance to the existing Silicon device which will enable operations at higher temperature that are not addressed by smaller bandgap (Eg=1.1 eV) of silicon based power devices.

The foregoing description of the preferred embodiments of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated.

For example, the HEMTs illustrated in relation with FIGS. 6 and 7 are normally-off device. However, embodiments of the present disclosure also comprise normally on (depletion mode) HEMTs.

It is intended that the scope of the invention be defined by the claims appended hereto and their equivalents. Reference to an element in the singular is not intended to mean one and only one unless explicitly so stated, but rather means one or more. Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . ."

It should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

The invention claimed is:

1. A method for making a HEMT device, the method comprising:
   providing a III-Nitride material substrate, a surface of which follows a plane that is not parallel to the C-plane of the III-Nitride material;
   growing an epitaxial layer of III-Nitride material on said substrate;
   etching in said epitaxial layer a recess having at least one plane wall that is not parallel to the surface of the substrate; said at least one plane wall being parallel to a polar plane of the III-Nitride material;
   forming on at least a portion of said at least one plane wall of the recess at least a carrier supply layer such that a 2DEG region is formed along the surface of said at least a portion of said at least one plane wall of the recess;
   forming a doped source region at the surface of said epitaxial layer, such that the doped source region is separated from said 2DEG region by a channel region of the epitaxial layer, the source region extending parallel to the surface of the substrate up to said at least one plane wall of the recess;

forming a gate insulating layer on the channel region of the epitaxial layer; and forming a gate contact layer on the gate insulating layer.

2. The method of claim 1, wherein the gate contact layer is arranged in the recess along a portion of said at least one plane wall of the recess and the channel region extends parallel to the gate contact layer along said portion of said at least one plane wall of the recess.

3. The method of claim 2, comprising said at least one carrier supply layer on a portion of said at least one plane wall of the recess such that a further 2DEG region is formed along the channel region of the epitaxial layer.

4. The method of claim 1, wherein said least one plane wall is parallel to the C-plane of the III-Nitride material.

5. The method of claim 1, wherein said at least one plane wall of the recess is perpendicular to the surface of the substrate.

6. The method claim 5, wherein the surface of the substrate follows the M-plane of the III-Nitride material.

7. The method claim 5, wherein the surface of the substrate follows the A plane of the III-Nitride material.

8. The method claim 1, wherein the III-Nitride material substrate is a free standing III-Nitride material substrate.

9. The method of claim 1, wherein the III-Nitride material is GaN.

10. The method claim 1, wherein the carrier supply layer comprises one of an epitaxial single crystal AlGaN, an epitaxial single crystal GaN/AlGaN and an epitaxial single crystal AlN.

11. The method of claim 1, wherein forming the carrier supply layer comprises forming a spacer layer on the III-Nitride material epitaxial layer and forming a barrier layer on the spacer layer.

12. The method of claim 1, wherein forming said at least a carrier supply layer on at least a portion of said at least one plane wall of the recess comprises growing the carrier supply layer on the III-Nitride material epitaxial layer such that a 2DEG is formed in the epitaxial III-Nitride material along the surface of said at least a portion of said at least one plane wall of the recess.

* * * * *